US008785879B1

(12) United States Patent  (10) Patent No.: US 8,785,879 B1
Frosien  (45) Date of Patent: Jul. 22, 2014

(54) ELECTRON BEAM WAFER INSPECTION SYSTEM AND METHOD OF OPERATION THEREOF

(71) Applicant: Jürgen Frosien, Riemerling (DE)

(72) Inventor: Jürgen Frosien, Riemerling (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 13/945,299

(22) Filed: Jul. 18, 2013

(30) Foreign Application Priority Data

May 6, 2013 (EP) ..................................... 13166694

(51) Int. Cl.
*H01J 3/20* (2006.01)
(52) U.S. Cl.
USPC .................... 250/396 ML; 250/307; 250/310
(58) Field of Classification Search
CPC ........................................................ H01J 3/20
USPC .................................................. 250/396 ML
See application file for complete search history.

(56) References Cited

U.S. PATENT DOCUMENTS

| 7,825,386 | B2* | 11/2010 | Liu et al. ................. 250/396 ML |
| 8,274,047 | B2* | 9/2012 | Naito et al. .................... 250/307 |
| 2004/0211913 | A1 | 10/2004 | Petrov |
| 2008/0121810 | A1 | 5/2008 | Liu et al. |

FOREIGN PATENT DOCUMENTS

EP  0150089  7/1985

OTHER PUBLICATIONS

European Search Report dated Oct. 31, 2013 for European Patent Application 13166694.3.

* cited by examiner

*Primary Examiner* — Phillip A Johnston
(74) *Attorney, Agent, or Firm* — Patterson & Sheridan, L.L.P.

(57) ABSTRACT

An electron beam wafer imaging system is described. The system includes an emitter for emitting an electron beam; a power supply for applying a voltage between the emitter and the column housing of at least 20 kV; an objective lens for focusing the electron beam on a wafer, wherein the magnetic lens component and the electrostatic lens component substantially overlap each other, wherein the electrostatic lens component has a first electrode, a second electrode and a third electrode; and a control electrode positioned along an optical axis from the position of the third electrode to the position of a specimen stage, wherein the control electrode is configured for control of signal electrons; a controller to switch between a first operational mode and a second operational mode, wherein the controller is connected to a further power supply for switching between the first operational mode and the second operational mode.

20 Claims, 4 Drawing Sheets

ELECTRON BEAM WAFER INSPECTION SYSTEM AND METHOD OF OPERATION THEREOF

TECHNICAL FIELD OF THE INVENTION

Embodiments of the present invention relate to devices for imaging with one or more charged particle beams and relate to objective lens systems including zoom. Embodiments of the present invention particularly relate to an electron beam wafer inspection system having an objective lens, specifically to an electron beam wafer inspection system and a method of operating an electron beam wafer inspection system.

BACKGROUND OF THE INVENTION

Charged particle beam apparatuses have many functions, in a plurality of industrial fields, including, but not limited to, critical dimensioning of semiconductor devices during manufacturing, defect review of semiconductor devices during manufacturing, inspection of semiconductor devices during manufacturing, exposure systems for lithography, detecting devices and testing systems. Thus, there is a high demand for structuring, testing and inspecting specimens within the micrometer and nanometer scale.

Micrometer and nanometer scale process control, inspection or structuring is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

Particularly for electron beam inspection (EBI) technology throughput is of foremost interest. Thereby, it is inter alia referred to, in particular, to surface inspection at low landing energies <500 eV and low secondary electron (SE) extraction fields. Normally, for high current density electron probe generation compound objective lenses are used (superimposed magnetic and electrostatic retarding field lenses). In those lenses the electron energy inside the column is reduced to the final landing energy. Overall performance is determined by the immersion factor which is the ratio of the column energy to the landing energy. The higher the immersion energy the better the performance is. For low landing energies and low SE-extraction fields, the focal power of the objective lens tends to be more and more performed by the electrostatic retarding field lens. Accordingly, the magnetic lens contribution is drastically reduced and, thereby, the overall objective lens performance is lowered causing higher aberrations.

With increasing immersion factor also the focal plane moves upwards into the direction of the source and finally into the lens body. In this case focusing on large samples becomes impossible.

To overcome this problem for low landing energy in combination with low extraction fields, longer focal length electrostatic lenses can be used. This is achieved by increasing the distance between the two electrostatic lens electrodes, which form the retarding lens, i.e. between which the primary beam is decelerated. However, longer focal length lenses have again larger aberrations. For such a solution even the column energy has to be or should be reduced additionally to some extent, which reduces optics performance even more (smaller immersion factor).

In view of the above, it is an object of the invention to provide an improved objective lens and an improved electron beam device that overcome at least some of the problems in the art.

SUMMARY OF THE INVENTION

In light of the above, an improved electron beam wafer imaging system, an improved multi-beam wafer imaging system, and an improved method of operating an electron beam wafer imaging system according to the independent claims are provided. Further advantages, features, aspects and details are evident from the dependent claims, the description and the drawings.

According to one embodiment, an electron beam wafer imaging system is provided. The system includes an emitter for emitting an electron beam, wherein the emitter is a cold field emitter, a thermally assisted field emitter, or a Schottky emitter; a power supply for applying a voltage between the emitter and the column housing of at least 20 kV; an objective lens for focusing the electron beam on a wafer, wherein the objective lens has a magnetic lens component and an electrostatic lens component, wherein the magnetic lens component and the electrostatic lens component substantially overlap each other, wherein the electrostatic lens component has a first electrode, a second electrode and a third electrode; and a control electrode positioned along an optical axis from the position of the third electrode to the position of a specimen stage, wherein the control electrode is configured for control of signal electrons; a controller to switch between a first operational mode and a second operational mode, wherein the controller is connected to a further power supply for switching between the first operational mode and the second operational mode.

According to another embodiment, a multi-beam wafer imaging system is provided. The system includes at least one wafer imaging system. The wafer imaging system includes an emitter for emitting an electron beam, wherein the emitter is a cold field emitter, a thermally assisted field emitter, or a Schottky emitter; a power supply for applying a voltage between the emitter and the column housing of at least 20 kV; an objective lens for focusing the electron beam on a wafer, wherein the objective lens has a magnetic lens component and an electrostatic lens component, wherein the magnetic lens component and the electrostatic lens component substantially overlap each other, wherein the electrostatic lens component has a first electrode, a second electrode and a third electrode; and a control electrode positioned along an optical axis from the position of the third electrode to the position of a specimen stage, wherein the control electrode is configured for control of signal electrons; a controller to switch between a first operational mode and a second operational mode, wherein the controller is connected to a further power supply for switching between the first operational mode and the second operational mode. The multi-beam wafer imaging system further includes at least one further emitter for emitting an electron beam, wherein the at least one further emitter is a cold field emitter, a thermally assisted field emitter, or a Schottky emitter, wherein the objective lens includes at least one further electrostatic lens component, wherein the at least one further electrostatic lens components has at least one further first electrode, at least one further second electrode and at least one further third electrode. The multi-beam system includes at least one further control electrode positioned along at least one further optical axis from the respective position of the respective third electrode to the position of a specimen stage, wherein the at least one further control electrode is configured for control of signal electrons.

According to a yet further embodiments, a method of operating an electron beam wafer imaging system is provided. The method includes emitting an electron beam having a brightness of $5 \times 10^7$ A/m$^2$/sr/eV or above, guiding the electron beam through an electron beam column with an energy of 20 keV or above, focusing the electron beam on a wafer with a magnetic field and an electrostatic field, wherein the magnetic field and the electrostatic field substantially overlap each other, wherein the electrostatic field is provided by a first electrode, a second electrode and a third electrode, and wherein the electrostatic field is configured to be switched between a first operational mode and a second operational mode by varying the focal length of the electrostatic lens component, and controlling the extraction field for signal electrons at the wafer with a control electrode.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Figure 1:
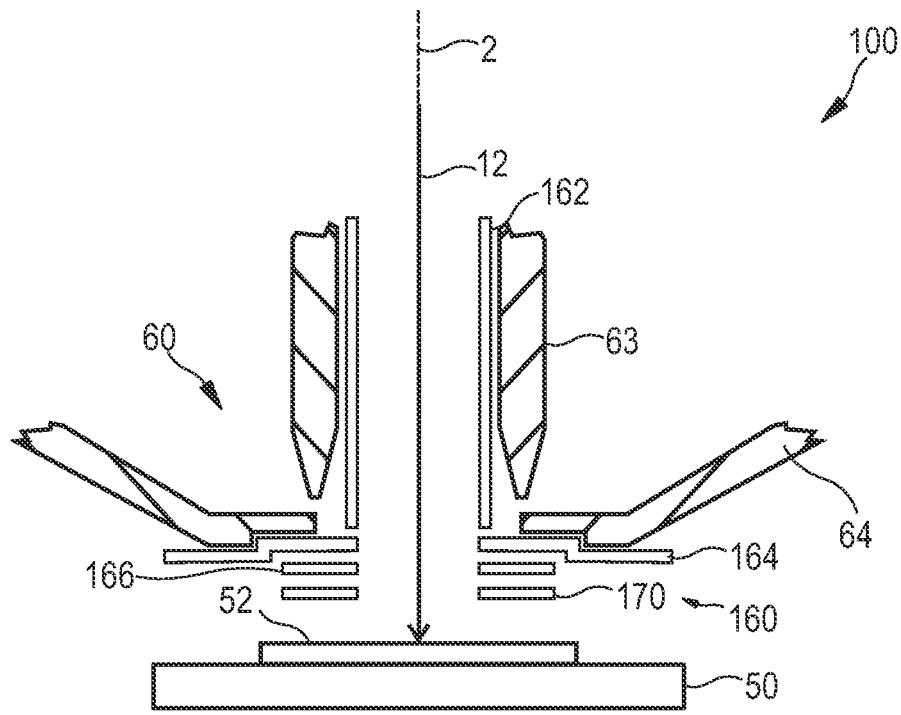
FIG. 1 illustrates a schematic partial view of a retarding field scanning charged particle beam device with a scan deflector according to embodiments described herein.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as an electron beam device including the detection of secondary electrons and/or backscattered electrons, which are also referred to as signal electrons. The present invention can still be applied for apparatuses and components detecting corpuscles such as secondary and/or backscattered charged particles in the form of electrons or ions, photons, X-rays or other signals in order to obtain a specimen image. Generally, when referring to corpuscles they are to be understood as a light signal in which the corpuscles are photons as well as particles, in which the corpuscles are ions, atoms, electrons or other particles.

A "specimen" or "wafer" as referred to herein, includes, but is not limited to, semiconductor wafers, semiconductor workpieces, and other workpieces such as memory disks and the like. Embodiments of the invention may be applied to any workpiece which is structured or on which material is deposited. A specimen or wafer includes a surface to be imaged and/or structured or on which layers are deposited, an edge, and typically a bevel. According to some embodiments, which can be combined with other embodiments described herein, the apparatus and methods are configured for or are applied for electron beam inspection (EBI), critical dimension measurement and defect review applications, where the microscopes and methods according to embodiments described herein, can be beneficially used in light of the desires for high throughput of these applications. According to some embodiments described herein, an E-beam inspection (EBI), critical dimension measurement (CD) tool, and/or defect review (DR) tool can be provided, wherein high resolution, large field of view, and high scanning speed can be achieved.

According to embodiments described herein, a wafer imaging system or a wafer SEM inspection tool refers to EBI tools, CD tools or DR tools, which are specific tools as understood by a person skilled in the art.

In the context of the here described embodiments, without limiting the scope of protection thereto, an intermediate beam acceleration system intends to describe a charged particle beam apparatus with initial high acceleration of the charged particles which will be decelerated to a landing energy shortly before striking the specimen or wafer. The energy or velocity ratio $v_{acc}/v_{landing}$ between the acceleration velocity $v_{acc}$ at which the charged particles are guided through the column and the landing velocity $V_{landing}$ at which the charged particles strike the specimen can be about at least 10 or higher, e.g. 20 or higher. Furthermore, the landing energy can be 2 keV or less, e.g. 1 keV or less, such as 500 eV or even 100 eV.

According to embodiments described herein, the objective lens for an electron beam system, i.e. the last lens before the electron beam impinges on the specimen or wafer, includes a magnetic-electrostatic lens. As shown in FIG. 1, the electrostatic lens component includes an upper electrode 162, which lies on a high potential and a lower electrode 166, which lies on a potential close to the sample voltage and which decelerates the electrons for providing the desired landing energy. These electrodes contribute to focusing, as well as to slowing down the beam to the required low primary beam voltage. Additionally, a middle electrode 164 and a control electrode 170 for extracting the signal electrons, such as secondary electrons (SE) or backscattered electrons, is provided. Thereby, the desire to provide for a very low landing energy, e.g. 100 eV and a low extraction field, can be provided without deteriorating overall performance of the electron beam imaging system.

FIG. 1 shows a portion of a scanning electron microscope 100. The objective lens includes the magnetic lens component 60 having an upper pole piece 63, a lower pole piece 64 and a coil (not shown in FIG. 1). The objective lens further includes an electrostatic lens component 160 having a first electrode 162, i.e. upper electrode in the figures, a second (middle) electrode 164, and a third electrode 166, i.e. lower electrode in the figures. Further, a control electrode for control of the signal electrons or the extraction field acting on the signal electrons respectively is provided at a position along the optical axis 2 from the position of the third electrode 166 to the specimen stage 50 or the specimen 52 respectively.

It is to be understood that the third electrode 166 is sometimes referred to as the proxi electrode or large proxi electrode as it is the closest electrode of the electrostatic lens component 160 to the specimen or the specimen stage. Further, the control electrode for extracting the signal electrons from the specimen is sometimes referred to as the small proxi as it is typically the closest electrode of the electron beam imaging system to the specimen or specimen stage. According to some embodiments, the small proxi can be at the same distance from the specimen as the large proxy. Typically, according to other embodiments, the small proxi is closer to the specimen as the large proxi.

According to the embodiments described herein, it is understood that the small proxi, i.e. the control electrode 170, has a small influence on the properties of the electrostatic lens component 160, yet is sufficiently small enough to be considered an individual element, with the functionality to control the extraction of the SEs from the specimen or the guidance of SEs released from the specimen.

The objective lens 60 focuses the electron beam 12, which travels in the column along optical axis 2, on the specimen 52, i.e. in a specimen plane. The specimen 52 is supported on a specimen support table 50. According to some embodiments, which can be combined with other embodiments described herein, scanning of an area of the specimen can be conducted by movement of the table in a first direction essentially perpendicular to the optical axis and by scanning lines in another, second direction essentially perpendicular to the optical axis and essentially perpendicular to the first direction.

Figure 3:
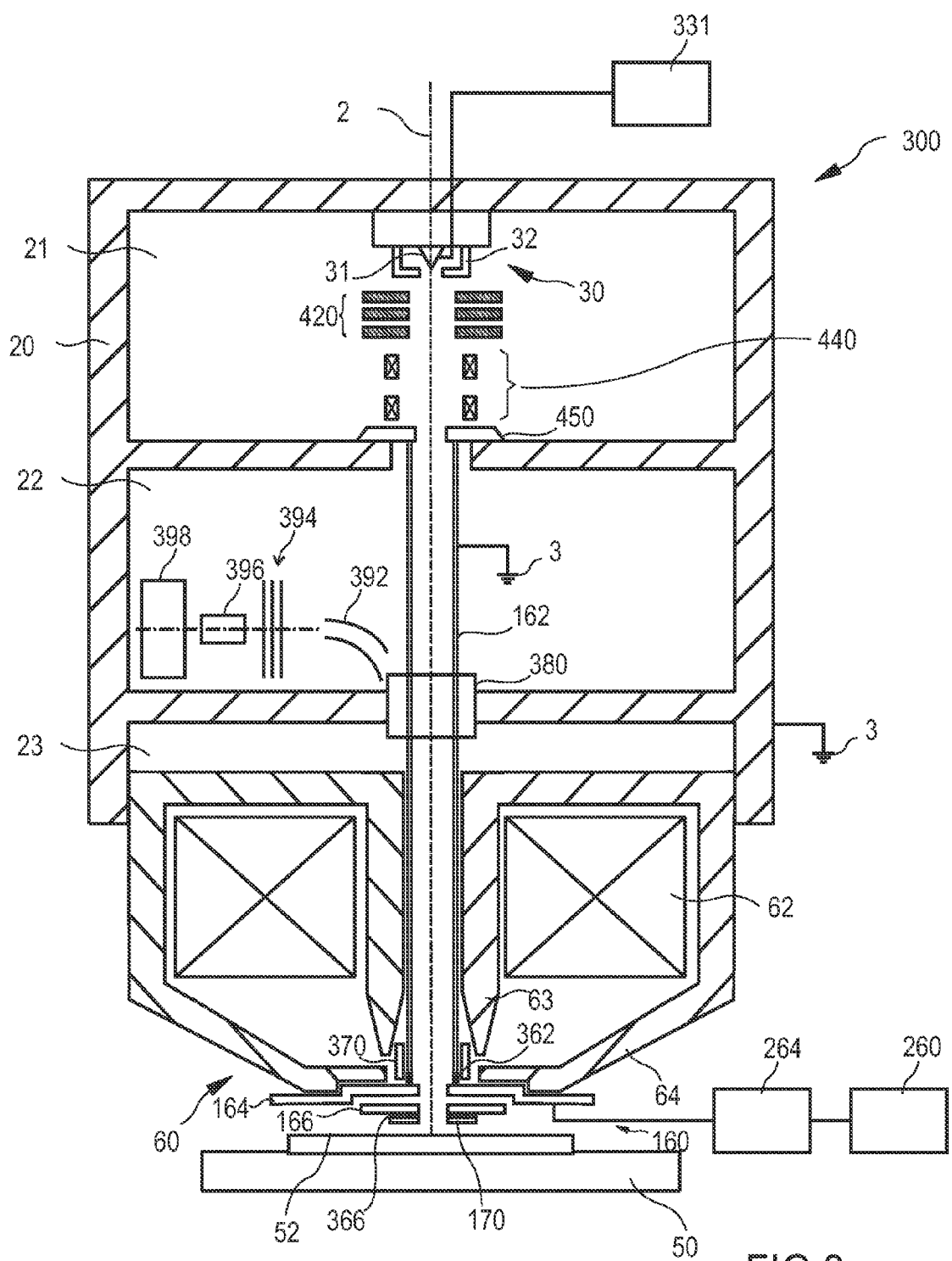
FIG. 3 illustrates a schematic view of a retarding field scanning charged particle beam device according to embodiments described herein.

If the beam is scanned according to a predetermined scan pattern, e.g. adjacent lines are scanned, the beam travels off the optical axis 2 in order to scan the required field-of-view. Thereby, a scanning deflector assembly (as shown in FIG. 3), e.g. a magnetic scanning deflector assembly, can be used. In particular for very fast scanning an electrostatic scan deflector (e.g. an octopole) is preferred. Typically, at least one scanning direction essentially perpendicular to the optical axis 2 (e.g. z-direction) is provided. Often two scanning directions (e.g. x-direction and y-direction) and the corresponding scanning assembly with more than one scanning deflector are provided. The one or more scanning deflectors are thereby configured for high speed scanning, e.g. to achieve a pixel rate in the GHz region (e.g. 3 GHz or above) and/or a line rate in the MHz region (e.g. 3 MHz or above). According to typical embodiments, which can be combined with other embodiments, the frequency of the control signal provided by the controller to the deflector is 0.1 MHz to 10 MHz.

According to embodiments described herein, a common EBI system can be constructed such that the performance is optimized or improved for an acceleration voltage $V_{acc}$ i.e. the high voltage within the column of 20 kV or above, e.g. $V_{acc}$=30 kV, and a landing energy of the primary electrons of $E_{pe}$>500 eV at a zero field offset (ZFO) of 0V/mm at the specimen of wafer ($E_{pe}$~"Energy$_{Primary\ Electrons}$"). However, further additional operational modes make embodiments of the present invention beneficial. For example, a low-low request with a landing energy of $E_{pe}$ around 100 eV at ZFO=0, a large field of view (FOV) and a low extraction voltage requires compromises as discussed. The suggested design changes prior to the present invention would incur a strong performance deterioration in the non-low-low regime, such that the previously existing operational modes suffer from the option to switch to the newly desired operational mode.

According to embodiments described herein, instead of lowering the proxi electrode in a diode electrostatic lens component, an inner or middle electrode is provided in a triode electrostatic lens component. Thereby, a similar increase of a lens gap can be obtained to provide for the additional operational mode of very low landing energy and low extraction field, wherein similar benefits can be obtained in this low-low regime The embodiments described herein, provide for an improvement with respect to at least some of the mentioned problems. The high optical performance at moderate landing energies of e.g. 500 eV or above is maintained by providing the optimized compound objective lens. An additional hardware solution is provided for the low landing energy/low extraction field operation mode. Accordingly, a controller can be utilized to switch between an not deteriorated existing operational mode with $E_{pe}$ of 500 eV or above, e.g. 500 eV≤$E_{pe}$≤1000 eV, and a further operational mode with low landing energy of 300 EV or below and a low extraction field, e.g. of 100 eV or below, or even 50 V/mm or below. Even 0V/mm or negative extraction fields can be achieved to control surface charging. Thereby, the electrostatic lens component having an electrostatic diode lens in which the column energy is reduced to the final landing energy is replaced by the electrostatic lens component (see, e.g. reference numeral 160 in FIG. 1) having a triode lens (3 electrode electrostatic lens).

Figures 2A, 2B:
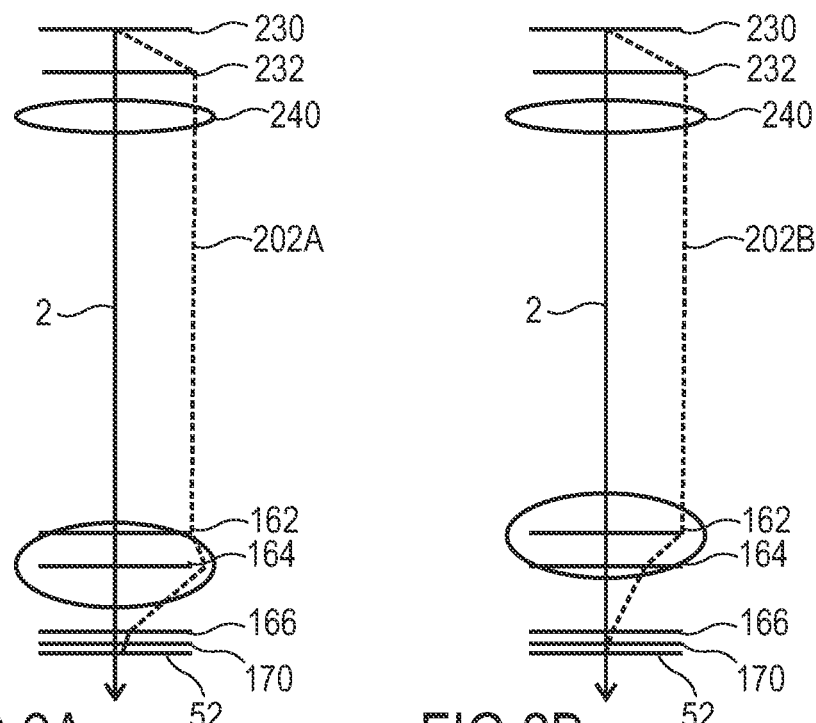
FIGS. 2A and 2B illustrate the beam energy or the potentials in the column, respectively, according to embodiments described herein and for different modes of operation.

FIGS. 2A and 2B explain the embodiments described herein, and illustrate yet further embodiments described herein, particularly with respect to methods of operating an EBI system, e.g. wherein between two operational modes can be switched. In FIGS. 2A and 2B the electron beam is generated at a source having an emitter, wherein FIGS. 2A and 2B show a plane 230 of the source or virtual source. The first plane 230 indicates a z-position of the source or virtual source along the optical axis 2. The electrons are accelerated to the voltage within the column, wherein the electrode configuration for acceleration, e.g. the extractor and the anode, is indicated by the second plane 232. Finally, the anode voltage with respect to the emitter voltage determines the column energy. The second plane indicates the z-position of the acceleration electrode along the optical axis 2. The electron beam is collimated and/or focused by the condenser lens 240. The curves 202A and 202B show the energy of the electron beam, i.e. the energy is higher the further distant the curves 202A and 202B are from the optical axis 2. As further shown, a first electrode 162 of an electrostatic lens component, a second electrode 164 of the electrostatic lens component, a third electrode 166 of the electrostatic lens component, and a control electrode are provided. The magnetic lens component is not illustrated in FIGS. 2A and 2B, which mainly refer to the electrostatic lens component. Yet according to some embodiments, and as shown in other figures of the present disclosure, a magnetic lens component can also be provided. Thereby, a combined magnetic electrostatic retarding lens is provided.

According to typical embodiments, which can be combined with other embodiments described herein, the first electrode 162 of the electrostatic lens component, the second electrode 164 of the electrostatic lens component, the third electrode 166 of the electrostatic lens component, and the control electrode are provided in this order along the path of the primary electrons, i.e. from the emitter to the specimen, specimen stage, or specimen plane, respectively. According to an alternative modification, the third electrode 166 of the electrostatic lens component and the control electrode can be provided at the same z-position along the optical axis 2, wherein the other electrodes are still to be provided in the above order.

In FIG. 2A the following potentials in kV can be provided, which correspond to an electron energy in keV and vice versa. The beam travels through the column at 20 keV or above, e.g. at 25 keV, even 30 keV, or even higher energy. Thereby, exemplarily for a 25 keV beam energy, the emitter or the emitter tip, respectively, can be at −25 kV and the extractor or typically the anode and the column is at ground.

According to embodiments described herein, the column energy is sometimes associated with the extractor potential and/or the anode potential. In many applications, the extractor potential and the anode potentials can be the same potential or the anode can even be provided by the extractor. However, there are applications, where the extractor and the anode are on different potentials. In such a case, the column energy is typically determined by the anode potential.

The first electrode 162, which can be provided by the beam guiding potential in the column, is, thus also at ground. The second electrode, 164 is at +5 kV, such that the electron energy is increased by 5 keV and the third electrode as well as the wafer are provided at −24 kV, such that a landing energy $E_{pe}$ is 1 keV. The control electrode for control of the signal electrons is e.g. at −22 kV.

According to typical embodiments, which can be combined with other embodiments described herein, the column can typically be at ground potential or can be at least from −5 kV to +5 kV, typically from −2 kV to +2 kV. Even though it can be understood by a person skilled in the art, that the beam energy is based on relative potentials, such that alternatively the emitter could be at ground or any other value and the column voltage could be at +25 kV or a corresponding other value for the above example having a beam energy of 25 keV, having the column potential at ground or within a limited range around ground can be considered beneficial for EBI systems according to embodiments described herein. Beyond the aspects relating to the energy of the primary electron beam and the corresponding potentials of the electrostatic lens components, wherein a retarding field lens is provided, also other aspects are to be considered.

For good performance of the system, primary beam deflection for alignment, primary beam deflection for scanning, and detection of signal electrons, such as secondary electrons (SE) or backscattered electrons, are additionally to be considered and improved. Having the column potential at ground potential or at least at a limited potential avoids having additional components like alignment deflectors, scan deflectors and elements for SE detection at a high potential or at least at very high potentials, e.g. 25 kV, which is provided in addition to the control signals of these components and elements. Providing these components at high potentials would result in inferior control thereof and a resulting inferior performance of the system.

According to embodiments described herein, the operation mode shown in FIG. 2A, which corresponds to moderate landing energies as described herein, has an immersion lens, wherein the deceleration is provided between the second electrode 164 and the third electrode 166. This operational mode is, thus, comparable to a diode lens operational mode and provides similar benefits as the diode lens operational mode. According to some embodiments, which can be combined with other embodiments described herein, the operational mode described with respect to FIG. 2A can be switched to the further operational mode shown in FIG. 2B and vice versa. Thereby, the operational mode shown in FIG. 2B can be referred to as a low-low-regime with low landing energies of 300 eV or below, such as 100 eV, and low extraction voltages.

In FIG. 2B the following potentials in kV can be provided, which correspond to an electron energy in keV and vice versa. The beam travels through the column at 20 keV or above, e.g. at 25 keV or even 30 keV. Thereby, exemplarily for a 25 keV beam energy, the emitter or the emitter tip, respectively, can be at −25 kV and the extractor or anode and the column is at ground. The first electrode 162, which can be provided by the beam guiding potential in the column, is, thus also at ground. The second electrode, 164 is on −5 kV, such that the electron energy is slightly decreased by 5 keV and the third electrode as well as the wafer are provided at −24.9 kV, such that a landing energy $E_{pe}$ is 100 eV. The control electrode for control of the signal electrons is e.g. at −24 kV or even −24.9 kV or even below. Thereby, as described above with respect to FIG. 2A, the column is typically on ground. Yet, when considering mainly the focusing properties of the electrostatic lens component and/or the compound magnetic-electrostatic objective lens the potentials of the entire system may be arbitrarily shifted according to some embodiments described herein.

According to typical embodiments described herein, the column energy, i.e. the energy at which the electrons travel through the column is above 20 keV, such as 25 keV or 30 keV. However, according to yet further modifications, which can be combined with other embodiments described herein, the column energy can also be at even higher potentials such as 40 keV or above or even 50 keV or above. Thereby, the landing energies on the wafer or specimen are not increased, but instead the immersion factor is increased, i.e. the electrons are decelerated more.

According to some embodiments, which can be combined herein the triode electrostatic lens can be operated with an increased focal length as shown in FIG. 2B as compared to the focal length as shown in FIG. 2A. Accordingly, a "zoom lens" can be provided according to embodiments described herein. The focal length can be switched for operational mode or can be adjusted according to predetermined conductions.

According to some embodiments, which can be combined with other embodiments described herein, one or more of the following relative potentials can be provided in the EBI system: (1) The electrode for providing the acceleration voltage, e.g. the extractor and/or anode, has a potential of +20 kV or more with respect to the emitter tip, particularly of 25 kV or more; (2) the potential within the column, at which the electron beam is guided through the column, is +20 kV or more with respect to the emitter tip, particularly of 25 kV or more; (3) the first electrode of the electrostatic lens component is at essentially the same potential as the acceleration voltage or can be at a potential of −1 kV to +1 kV as compared to the acceleration voltage; (4) the second electrode of the electrostatic lens component is at a potential of −7 kV to +7 kV, e.g. −5 kV to +5 kV or −3 kV to +3 kV as compared to the first electrode of the electrostatic lens component; (5) the third electrode of the electrostatic lens component is at a potential of +50 V to +2 kV as compared to the potential of the emitter tip, for example at a potential of +50 V to +1 kV; (6) the specimen or wafer is at a potential of +50 V to +2 kV as compared to the potential of the emitter tip, for example at a potential of +50 V to +1 kV; and (7) the control electrode is at a potential of +2 kV to −2 kV, typically +500 V to −1 kV, as compared to the potential of the specimen or wafer. Thereby, particularly for the potentials provided for the second electrode of the electrostatic immersion lens switching between operational modes can be provided and the system can include a respective controller and a respective power supply.

As described above, the potential at which the acceleration voltage is provided, i.e. the voltage of the beam guiding in the column and/or, if the beam guiding in the column is not provided by e.g. a tube forming the first electrode of the electrostatic lens component, the potential of this first electrode can be ground or close to ground, e.g. within −1 kV to 1 kV. Accordingly, according to some embodiments, which can be combined with other embodiments described herein, the power supply for providing a potential to the second electrode of the electrostatic immersion lens can be a bi-polar power supply. That is the power supply can provide positive and negative potentials to the electrode.

As described above, embodiments described herein, e.g. having the triode lens, offer a series of advantages and flexibilities in operation. 1) The lens can be optimized for moderate (high) landing energy operation, e.g. energies of 500 eV or above, e.g. up to 1.5 keV. This is mainly done by optimization of the distance of the center electrode to the last electrode of the triode. The first electrode is at the potential of the center electrode or below. This means that the triode is operated at an optimized or improved diode. 2) For low landing energy/low extraction field operation, the triode is activated in which the column energy is reduced sequentially by the center and the last electrode to the final energy. By these means a long focal lens can be realized without affecting the moderate/high energy operation mentioned under item 2) above. 3) Further, in the event that the focal length increase described under item 2) above is not sufficient and the column energy ($V_{acc}$~"Voltage$_{Acceleration}$") has to be reduced to achieve the operation parameters, the invention offers an additional advantage. All modes can be realized with on column energy with neither performance loss nor the necessity of changing the column energy. Changing column energy has the practical disadvantage that a re-alignment and re-setting of the remaining components is required which is time consuming. The presented configuration not only allows the sequential deceleration of the primary beam in the low landing energy/low extraction field operation, which relates to an decelerating mode of the triode lens, but also allows for an acceleration mode in which the center electrode accelerates the beam before it is finally decelerated to the landing energy. With this two-mode operation, it can be achieved that the objective lens is always operated at improved or optimized conditions for all operation modes without the necessity of changing the column voltage.

Further embodiments can be described with respect to FIG. 3. FIG. 3 shows a charged particle beam device, such as an SEM imaging apparatus, i.e. a wafer imaging system 300. The electron beam column 20 provides a first chamber 21, a second chamber 22 and a third chamber 23. The first chamber, which can also be referred to as a gun chamber, includes the electron source 30 having an emitter 31 and suppressor 32.

According to embodiments described herein, the emitter is connected to a power supply 331 for providing a voltage to the emitter. For the examples described herein, the potential provided to the emitter is such that the electron beam is accelerated to an energy of 20 keV or above. Accordingly, typically the emitter is biased to a potential of −20 keV or higher negative voltages, e.g. in the case where the column and the beam guiding tube, which also provides the first electrode 162 in FIG. 3, are on ground potential. As described above, having the emitter 31 on a positive potential is a typical embodiment with the benefits that the column and the beam guiding tube can be at ground or at a moderate potential. Yet, with respect to the focusing properties of the zoom lens according to embodiments described herein, the emitter could also be grounded and a power supply could be connected to the electrode 162 shown in FIG. 3.

An electron beam is generated by the electron beam source 30. The beam is aligned to the beam limiting aperture 450, which is dimensioned to shape the beam, i.e. blocks a portion of the beam. Thereafter, the beam passes through the beam separator 380, which separates the primary electron beam and the signal electron beam, i.e. the signal electrons. The primary electron beam is focused on the specimen or wafer 52 by the objective lens. The specimen is positioned on a specimen position on the specimen stage 50. On impingement of the electron beam, for example, secondary or backscattered electrons are released from the specimen 52, which can be detected by the detector 398. Even though backscattered electrons and secondary electrons are typically detected by the detector, some passages of this disclosure relate to secondary electrons only, i.e. as a comparison to primary electrons, and it is understood that backscattered electrons are also considered to be signal electrons or similar to secondary electrons as understood herein, i.e. there are secondary products for signal generation of the image.

According to some embodiments, which can be combined with other embodiments described herein, a condenser lens 420 and a beam shaping or beam limiting aperture 450 is provided. The two-stage deflection system 440 is provided between the condenser lens and the beam shaping aperture 450 for alignment of the beam to the aperture. According to embodiments described herein, which can be combined with other embodiments described herein, the electrons are accelerated to the voltage in the column (see below) by an extractor or by the anode. The extractor can, for example, be provided by the first (upper) electrode of the condenser lens 420 or by a further electrode (not shown).

As shown in FIG. 3, the objective lens has a magnetic lens component 160 having pole pieces 64/63 and a coil 62, which focuses the charged particle beam on a specimen 52. The specimen can be positioned on a specimen stage 50. The objective lens shown in FIG. 3 includes the upper pole piece 63, the lower pole piece 64 and the coil 62 forming a magnetic lens component 60 of the objective lens. Further, a first (upper) electrode 162, a second electrode 164, and the third (lower) electrode 166 form an electrostatic lens component 160 of the objective lens.

According to the embodiments described herein, the magnetic lens component and the electrostatic lens component substantially overlap each other to form a compound lens. In order to achieve the combination of the magnetic lens component and the electrostatic lens component, the two fields substantially overlap with each other according to embodiments of the invention. Within one meaning of the embodiments of the invention it is to be understood that areas formed by the half-width value (HWFM) of each field distribution in the drawing overlap by at least 10%, typically by at least 50%. Additionally or alternatively, the field distribution of the electrostatic lens component is within the field distribution of the magnetic field component.

A control electrode 170 for control of the signal particle beam, such as secondary electrons (SE) or backscattered electrons, is further provided. Thereby, the control electrode serves inter alia for control of the charge of the specimen or wafer, i.e. control of the net current provided to the specimen. Typically, it is desired that the amount of electrons impinging on the specimen equals the amount released or leaving the specimen. Thereby, charging of the specimen can be reduced or avoided. However, also positive or negative sample charging can be achieved by appropriate control voltages in combination with suitable landing energies, in case in which it is required by the application. Accordingly, the sample charging can be controlled.

Further, a scanning deflector assembly 370 is provided. The scanning deflector assembly 370 can, for example, be a magnetic, but preferably an electrostatic scanning deflector assembly, which is configured for high pixel rates. According to typical embodiments, which can be combined with other embodiments described herein, the scanning deflector assembly 370 can be a single stage assembly as shown in FIG. 3. Alternatively also a two-stage or even a three-stage deflector assembly can be provided. Thereby, each stage is provided at a different position along the optical axis 2.

Signal electrons, e.g. secondary and/or backscattered electrons, are extracted from the wafer or specimen by control electrode 170 and are further accelerated within the objective lens. The beam separator 380 separates the primary and the signal electrons. The beam separator can be a Wien filter and/or can be at least one magnetic deflector, such that the signal electrons are deflected away from the optical axis 2. The signal electrons are then guided by a beam bender 392, e.g. a hemispherical beam bender, and a lens 394 to the detector 398. Further elements like a filter 396 can be provided. According to yet further modifications, the detector can be a segmented detector configured for detecting signal electrons depending on the starting angle at the specimen.

The potentials of the emitter, the column and the electrodes can be provided in the system according to any of the embodiments described herein. As a typical example the beam guiding tube, which also serves as the first electrode 162 of the electrostatic triode lens is on ground potential. Accordingly, the electrons travel through the column, which is on ground potential. The housing of the column can thereby also be provided on ground potentials. This is indicated by the reference numerals 3 in FIG. 3.

The second electrode 164 of the electrostatic lens component is connected to the first electrode 162 of the electrostatic lens component by insulator 362. Further, according to additional or alternative implementations and as shown in FIG. 3, the second electrode is connected to power supply 264. The power supply 264 can be a bipolar power supply. It can be configured to provide a positive and a negative voltage in the range of −7 kV to 7 kV. As shown in FIG. 3, the power supply can be connected to controller 260. The controller can control the voltage provided to the second electrode by power supply 264 in order to switch between the operational modes described herein. Thereby, for example, the focal length of the objective lens and particularly the electrostatic lens component of the objective lens is varied.

As shown in FIG. 3, the control electrode 170 is connected to the third electrode 166 of the electrostatic lens component with insulator 366. Thereby, typically the control electrode 170 is provided between third electrode 166 and the specimen stage 50. According to an alternative option, the control electrode can be provided as an inlay within the third electrode such that the control electrode and the third electrode have substantially the same distance from the specimen stage 50.

Figure 4:
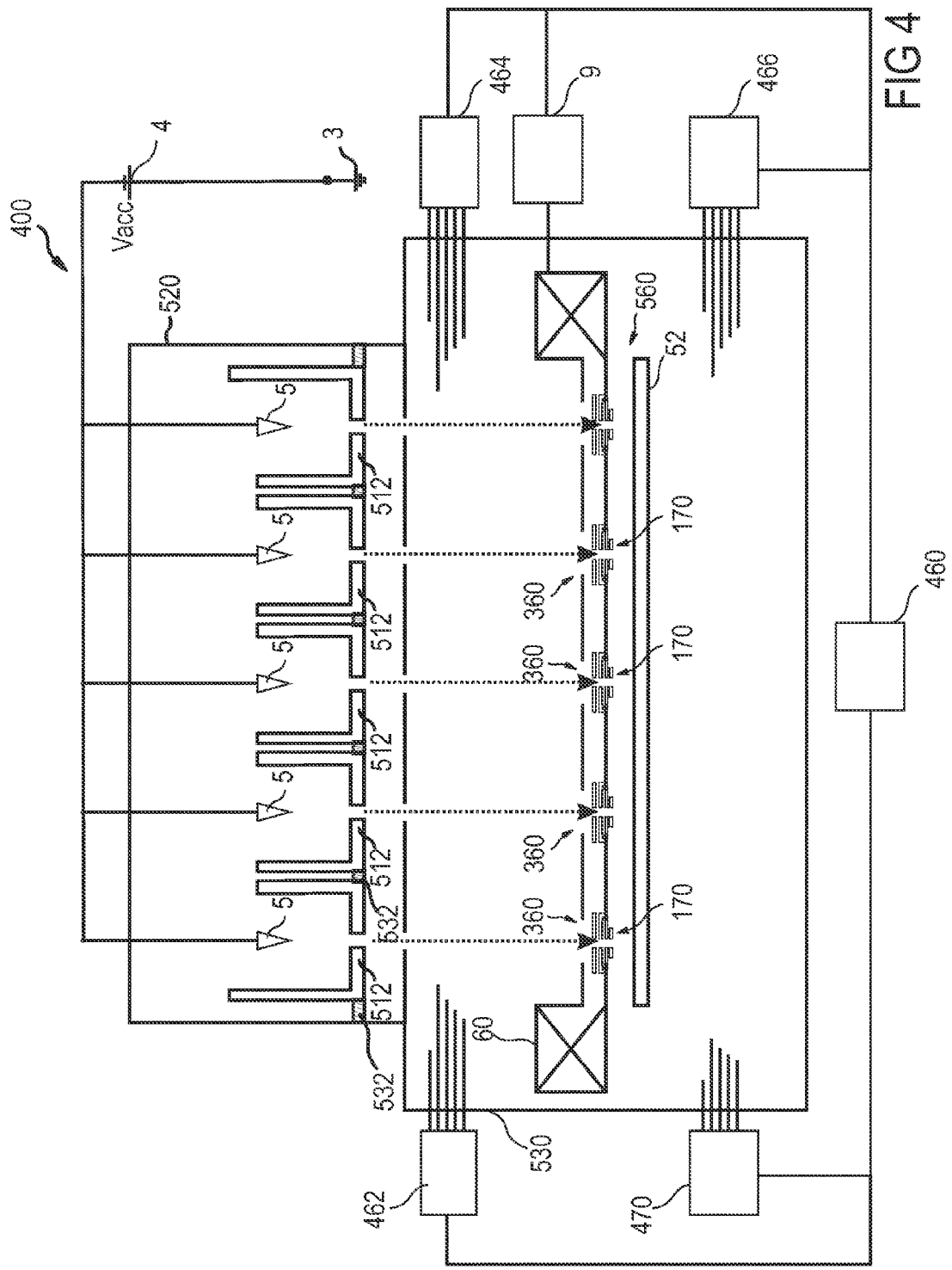
FIG. 4 illustrates a schematic view of a retarding field scanning charged particle beam device having two or more beams according to embodiments described herein.

FIG. 4 illustrates yet further embodiments, wherein the retarding field scanning microscope, i.e. wafer imaging system 400 is provided as a multi-beam device. Typically two or more beams can be provided in a multi-beam device. As an example, FIG. 4 shows five emitters 5 such that five electron beams are emitted in the gun chamber 520. The emitter tips are biased to an acceleration potential $V_{acc}$ by voltage supply 4, which provides a potential to the tips as compared to ground 3. Electrodes 512, e.g. extractors or anodes are provided, e.g. in a cup-like shape. These electrodes are electrically insulated by insulators 532 with respect to each other and with respect to the gun chamber 520. According to some embodiments, which can be combined with other embodiments described herein, also two or more of the electrodes selected from the group consisting of extractor and anode can be provided. Typically, these electrodes 512 are biased to potentials by voltage supplies (not shown) in order to control the two or more electron beams.

The charged particle beams travel in a further chamber 530, in which a specimen 52 is provided. The objective lens 560 focuses the beams on the specimen or in a specimen plane, respectively. Thereby, the objective lens can have a magnetic lens component 60 with a common magnetic lens portion, i.e. a magnetic lens portion acting on two or more of the charged particle beams. Thereby, for example, one common excitation coil is provided to a pole piece unit or a pole piece assembly, wherein several openings for passing of the two or more electron beams through the pole piece unit are provided. The one common excitation coil excites the pole piece unit, such that, for example, one beam is focused per opening. Power supply 9 can provide the current for the magnetic lens portion of the objective lens.

As shown in FIG. 4, the objective lens 560 further includes an electrostatic lens component 160. For example, an electrostatic lens portions 560 having a first electrode, a second electrode, and a third electrode 130 are provided. As shown in FIG. 4, the first electrode can also be provided as a separated electrode for one or more of the electrostatic lens portions. That is the first electrode can be separate and/or independent of a beam guiding tube in the column. This can also apply for the single beam columns described herein. Further, for each of the electrons beams a control electrode 170 is provided. Four power supplies 462, 464, 466 and 470 are shown in FIG. 4. Each of the power supplies has five connection lines for respective electrodes for each of the five electrostatic lens components. For example, power supply 462 can be connected to the respective first electrodes, power supply 464 can be connected to the respective second electrodes, power supply 466 can be connected to the respective third electrodes, and power supply 470 can be connected to the respective control electrodes. The controller 460 is connected to the voltage supplies 462-466 and 470 for the electrodes of the electrostatic lens components and the control electrodes. The connection lines entering the column housing from the respective power supplies (the rest of which is omitted for better overview) illustrate that each of the electrodes for the individual beams can be controlled independently. However, it can be understood that one or more of the electrodes of the electrostatic lens components and one or more of the control electrodes can also be bias with a common power supply. Further, it is noted that particularly the power supply 462 can be omitted if the first electrode is grounded as explained above.

According to some embodiments, the objective lens can be provided according to any of the embodiments described herein. Thereby, it has to be considered that particularly for EBI applications, but also for CD/DR applications, as compared to common wafer imaging throughput, is a critical aspect to be considered. The operational modes described herein are useful for high throughput. Thereby, also cold field emitters (CFE) and thermally assisted CFEs can be used to increase the throughput. Accordingly, the combination of an objective lens with a CFE, a thermally assisted field emitter, or a Schottky emitter is particularly useful, and even more, as a further implementation, in combination with a multi-electron beam device as e.g. described with respect to FIG. 4.

The embodiments described herein, may as well include additional components (not shown) such as condenser lenses, deflectors of the electrostatic, magnetic or compound electrostatic-magnetic type, such as Wien filters, stigmators of the electrostatic, magnetic or compound electrostatic-magnetic type, further lenses of the electrostatic, magnetic or compound electrostatic-magnetic type, and/or other optical components for influencing and/or correcting the beam of primary and/or signal charged particles, such as deflectors or apertures. Indeed, for illustration purposes, some of those components are shown in the figures described herein. It is to be understood that one or more of such components can also be applied in embodiments of the invention.

Figure 5:
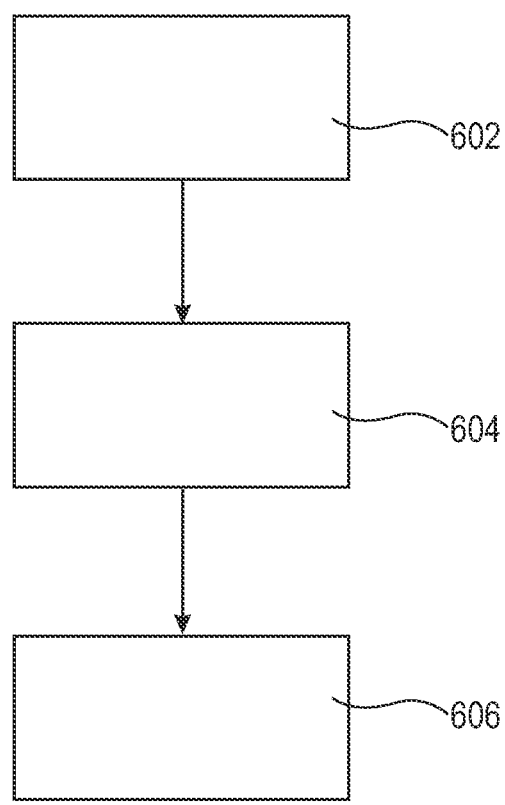
FIG. 5 illustrates a method of operating a retarding field scanning charged particle beam device according to embodiments described herein.

According to some embodiments, a method of imaging a specimen is provided as illustrated in FIG. 5. Thereby, particularly a retarding field scanning microscope is utilized, wherein a charged particle beam, e.g. an electron beam is used. In step 602 a charged particle beam, preferably an electron beam, is generated in the retarding field scanning microscope. In step 604 the beam is focused on the specimen or wafer in a first operational mode. For image generation scanning of the beam can be conducted, e.g. with a scanning deflector assembly. In step 606 it is switched to a second operation mode by changing one or more potentials of the electrodes and the primary electron beam is focus on the specimen or wafer. The objective lens includes a magnetic lens component and an electrostatic lens component, and wherein the electrostatic lens portion includes a first electrode, as second electrode and a third electrode in this order. According to beneficial solutions the first electrode and/or the electron energy in the column ($V_{acc}$) is not varied when switching between the operational modes. The operational modes typically include varying the focal length of the electrostatic lens component and/or varying the primary electron beam landing energy. For example, the primary beam energy can be varied from low energies of 300 eV or below to moderate energies of 500 eV to 1500 eV. According to embodiments described herein no mechanical changes or re-alignments are needed when switching between modes. Further a good or optimized performance can be provided for both modes.

According to some embodiments, which can be combined with other embodiments described herein, one or more of the following relative potentials can be provided in the EBI system and according to further modifications of the methods described with respect to FIG. 5. (1) The electrode for providing the acceleration voltage, e.g. the extractor-anode configuration, is biased to a potential of +20 kV or more with respect to the emitter tip, particularly of 25 kV or more; (2) the potential within the column, at which the electron beam is guided through the column, is +20 kV or more with respect to the emitter tip, particularly of 25 kV or more; (3) the first electrode of the electrostatic lens component is at essentially the same potential as the acceleration voltage or can be at a potential of −1 kV to +1 kV as compared to the acceleration voltage; (4) the second electrode of the electrostatic lens component is biased to a potential of −7 kV to +7 kV, e.g. −5 kV to +5 kV or −3 kV to +3 kV as compared to the first electrode of the electrostatic lens component; (5) the third electrode of the electrostatic lens component is biased to a potential of +50 V to +2 kV as compared to the potential of the emitter tip, for example at a potential of +50 V to +1 kV; (6) the specimen or wafer is biased to a potential of +50 V to +2 kV as compared to the potential of the emitter tip, for example at a potential of +50 V to +1 kV; and (7) the control electrode is at a potential of +500 V to −2 kV as compared to the potential of the specimen or wafer. Thereby, particularly for the potentials provided for the second electrode of the electrostatic immersion lens switching between operational modes can be provided and the system can include a respective controller and a respective power supply. Further, biasing to ground potential is considered similar as grounding the respective electrode or component of the system.

While the foregoing is directed to embodiments of the invention, other and further embodiments of the invention may be devised without departing from the basic scope thereof, and the scope thereof is determined by the claims that follow.

The invention claimed is:

1. An electron beam wafer imaging system, comprising:
an emitter for emitting an electron beam, wherein the emitter is a cold field emitter, a thermally assisted field emitter, or a Schottky emitter;
a power supply for applying a voltage between the emitter and the column housing of at least 20 kV;
an objective lens for focusing the electron beam on a wafer, wherein the objective lens has a magnetic lens component and an electrostatic lens component, wherein the magnetic lens component and the electrostatic lens component substantially overlap each other,
wherein the electrostatic lens component has a first electrode, a second electrode and a third electrode; and
a control electrode positioned along an optical axis from the position of the third electrode to the position of a specimen stage, wherein the control electrode is configured for control of signal electrons;
a controller to switch between a first operational mode and a second operational mode, wherein the controller is connected to a further power supply for switching between the first operational mode and the second operational mode, where said first operational mode corresponds to moderate landing energies and said second operational mode corresponds to low landing energies.

2. The electron beam wafer imaging system according to claim 1, wherein the further power supply is connected to the second electrode.

3. The electron beam wafer imaging system according to claim 1, wherein the first electrode is connected to ground.

4. The electron beam wafer imaging system according to claim 2, wherein the first electrode is connected to ground.

5. The electron beam wafer imaging system according to claim 1, wherein the further power supply is connected to the second electrode and is a bipolar power supply for providing voltages from −7 kV to +7 kV.

6. The electron beam wafer imaging system according to claim 1, wherein the first electrode is provided in form of a beam guiding tube for guiding the electron beam through at least 50% of the length of the system along the optical axis.

7. The electron beam wafer imaging system according to claim 1, further comprising an acceleration electrode for acceleration of the electron beam emitted from the emitter, wherein the acceleration electrode is connected to a power supply for providing a potential of −5 kV to +5 kV or wherein the acceleration electrode is connected to ground.

8. The electron beam wafer imaging system according to claim 1, wherein the second electrode is mounted in the system attached to an insulator, which is further attached to the first electrode.

9. The electron beam wafer imaging system according to claim 1, wherein the control electrode is mounted in the system attached to a further insulator, which is further attached to the third electrode.

10. A multi-beam wafer imaging system, comprising
a wafer imaging system comprising:
an emitter for emitting an electron beam, wherein the emitter is a cold field emitter, a thermally assisted field emitter, or a Schottky emitter;
a power supply for applying a voltage between the emitter and the column housing of at least 20 kV;

an objective lens for focusing the electron beam on a wafer, wherein the objective lens has a magnetic lens component and an electrostatic lens component, wherein the magnetic lens component and the electrostatic lens component substantially overlap each other, wherein the electrostatic lens component has a first electrode, a second electrode and a third electrode; and a control electrode positioned along an optical axis from the position of the third electrode to the position of a specimen stage, wherein the control electrode is configured for control of signal electrons;

a controller to switch between a first operational mode and a second operational mode, wherein the controller is connected to a further power supply for switching between the first operational mode and the second operational mode, where said first operational mode corresponds to moderate landing energies and said second operational mode corresponds to low landing energies;

the multi-beam wafer imaging system further comprises:

at least one further emitter for emitting an electron beam, wherein the at least one further emitter is a cold field emitter, a thermally assisted field emitter, or a Schottky emitter;

wherein the objective lens comprises at least one further electrostatic lens component;

wherein the at least one further electrostatic lens components has at least one further first electrode, at least one further second electrode and at least one further third electrode; and at least one further control electrode positioned along at least one further optical axis from the respective position of the respective third electrode to the position of a specimen stage, wherein the at least one further control electrode is configured for control of signal electrons.

11. The electron beam wafer imaging system according to claim 10, wherein the further power supply is connected to the second electrode.

12. The electron beam wafer imaging system according to claim 10, wherein the first electrode is connected to ground.

13. The electron beam wafer imaging system according to claim 10, wherein the further power supply is connected to the second electrode and is a bipolar power supply for providing voltages from −7 kV to +7 kV.

14. A method of operating an electron beam wafer imaging system, comprising:

emitting an electron beam having a brightness of $5 \times 10^7$ A/m$^2$/sr/eV or above;

guiding the electron beam through an electron beam column with an energy of 20 keV or above;

focusing the electron beam on a wafer with a magnetic field and an electrostatic field, wherein the magnetic field and the electrostatic field substantially overlap each other, wherein the electrostatic field is provided by a first electrode, a second electrode and a third electrode, and wherein the electrostatic field is configured to be switched between a first operational mode and a second operational mode by varying the focal length of the electrostatic lens component, where said first operational mode corresponds to moderate landing energies and said second operational mode corresponds to low landing energies; and controlling the extraction field for signal electrons at the wafer with a control electrode.

15. The method according to claim 14, wherein the electron beam is emitted at a positive potential of the emitter with respect to ground of 20 kV or more, and wherein the electron beam is guided through an electron beam column at ground potential.

16. The method according to claim 14, wherein the second electrode providing the electrostatic field is at a potential of −7 kV to +7 kV as compared to the first electrode providing the electrostatic field for switching between the first operational mode and the second operational mode.

17. The method according to claim 14, wherein the third electrode providing the electrostatic field and/or the wafer is at a potential of +50 V to +2 kV as compared to the potential of the emitter tip.

18. The method according to claim 17, wherein the third electrode providing the electrostatic field and/or the wafer is at a potential of +50 V to +1 kV as compared to the potential of the emitter tip.

19. The method according to claim 14, wherein the control electrode is biased to a potential of +2 kV to −2 kV as compared to the potential of the specimen or wafer.

20. The method according to claim 19, wherein the control electrode is biased to a potential of +2 kV to −1 kV as compared to the potential of the specimen or wafer.

* * * * *